US008239725B2

(12) United States Patent
Radke

(10) Patent No.: US 8,239,725 B2
(45) Date of Patent: *Aug. 7, 2012

(54) DATA STORAGE WITH AN OUTER BLOCK CODE AND A STREAM-BASED INNER CODE

(75) Inventor: William H. Radke, Los Gatos, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/281,007

(22) Filed: Oct. 25, 2011

(65) Prior Publication Data

US 2012/0042225 A1  Feb. 16, 2012

Related U.S. Application Data

(63) Continuation of application No. 11/774,377, filed on Jul. 6, 2007, now Pat. No. 8,065,583.

(51) Int. Cl.
*H03M 13/00* (2006.01)
(52) U.S. Cl. ........................ 714/752; 714/758
(58) Field of Classification Search .................. 714/752, 714/758
See application file for complete search history.

(56) References Cited

U.S. PATENT DOCUMENTS

| | | | |
|---|---|---|---|
| 4,112,502 A | 9/1978 | Scheuneman | |
| 5,942,004 A | 8/1999 | Cappelletti | |
| 5,956,743 A | 9/1999 | Bruce et al. | |
| 6,023,781 A | 2/2000 | Hazama | |
| 6,279,133 B1 | 8/2001 | Vafai et al. | |
| 6,591,394 B2 | 7/2003 | Lee et al. | |
| 6,628,723 B1 | 9/2003 | Gerlach et al. | |
| 6,731,538 B2 | 5/2004 | Noda et al. | |
| 6,732,322 B1 | 5/2004 | Miyauchi et al. | |
| 6,839,870 B2 | 1/2005 | Fanfelle | |
| 6,871,303 B2 | 3/2005 | Halter | |
| 6,895,543 B2 | 5/2005 | Hazama | |
| 7,061,804 B2 | 6/2006 | Chun et al. | |
| 7,184,356 B2 | 2/2007 | Noguchi et al. | |
| 7,389,465 B2 | 6/2008 | Radke | |
| 7,478,314 B1 | 1/2009 | Cheong et al. | |
| 7,643,342 B2 | 1/2010 | Litsyn et al. | |
| 7,844,879 B2 | 11/2010 | Ramamoorthy et al. | |
| 7,904,780 B2 | 3/2011 | Brandman | |
| 7,962,831 B2 | 6/2011 | Park et al. | |

(Continued)

FOREIGN PATENT DOCUMENTS

JP  2000149592  5/2000

(Continued)

OTHER PUBLICATIONS

European Patent Office; Extended European Search Report of Related European Application, Application No. 08851231.4; Mailing date Jan. 30, 2012.

(Continued)

*Primary Examiner* — Sam Rizk
(74) *Attorney, Agent, or Firm* — Knobbe Martens Olson & Bear LLP

(57) ABSTRACT

Apparatus and methods store stream-based error recovery data for a memory array, such as a NAND flash array. Conventionally, data is block coded per industry specification and stored in the memory array. Within the limits of the block code, this technique provides for correction of errors. By applying a stream-based inner code, that is, concatenating the outer block code with an outer code, the error correction can be further enhanced, enhancing the reliability of the device. This can also permit a relatively small-geometry device to be used in a legacy application.

12 Claims, 5 Drawing Sheets

U.S. PATENT DOCUMENTS

| | | | |
|---|---|---|---|
| 2002/0120820 | A1 | 8/2002 | Higuchi et al. |
| 2003/0156454 | A1 | 8/2003 | Wei et al. |
| 2004/0268065 | A1 | 12/2004 | Hilton et al. |
| 2005/0114587 | A1 | 5/2005 | Chou et al. |
| 2006/0221752 | A1 | 10/2006 | Fasoli et al. |
| 2007/0061689 | A1 | 3/2007 | Park et al. |
| 2007/0124647 | A1 | 5/2007 | Chen et al. |
| 2007/0171714 | A1 | 7/2007 | Wu et al. |
| 2007/0171730 | A1 | 7/2007 | Ramamoorthy et al. |
| 2007/0266295 | A1 | 11/2007 | Conley |
| 2007/0266296 | A1 | 11/2007 | Conley |
| 2008/0034272 | A1 | 2/2008 | Wu et al. |
| 2008/0137414 | A1 | 6/2008 | Park et al. |
| 2008/0163023 | A1 | 7/2008 | Hong et al. |
| 2008/0168319 | A1 | 7/2008 | Lee et al. |
| 2008/0320361 | A1 | 12/2008 | Fukuda et al. |
| 2009/0013233 | A1 | 1/2009 | Radke |
| 2009/0100307 | A1 | 4/2009 | Lee |
| 2010/0023800 | A1 | 1/2010 | Harari et al. |
| 2010/0115376 | A1 | 5/2010 | Shalvi et al. |
| 2011/0060969 | A1 | 3/2011 | Ramamoorthy et al. |

FOREIGN PATENT DOCUMENTS

| | | |
|---|---|---|
| KR | 100766042 | 10/2007 |
| WO | WO 2004062113 | 7/2004 |
| WO | WO 2006070668 | 7/2006 |
| WO | WO 2007084751 | 7/2007 |

OTHER PUBLICATIONS

The International Bureau of WIPO; International Preliminary Report on Patentability of related PCT Application No. PCT/US2008/068236, filed Jun. 25, 2008; mailing date Jan. 21, 2010; Geneva, Switzerland.

The International Bureau of WIPO; International Preliminary Report on Patentability of related PCT Application No. PCT/US2008/068240, filed Jun. 25, 2008; mailing date Jan. 21, 2010; Geneva, Switzerland.

International search report mailed Dec. 29, 2008 in PCT Application No. PCT/US2008/068240.

International search report mailed Jan. 20, 2009 in PCT Application No. PCT/US2008/068236.

USPTO; Office Action dated Sep. 9, 2010, from related U.S. Appl. No. 11/944,023 (filed Nov. 21, 2007).

USPTO; Office Action dated Dec. 9, 2010, from related U.S. Appl. No. 11/944,023 (filed Nov. 21, 2007).

European Patent Office; Extended European Search Report of related European Application, Application No. 08852229.7; Report issue date Nov. 22, 2011.

USPTO; Office Action dated Oct. 3, 2011, from related U.S. Appl. No. 13/154,150 (filed Jun. 6, 2011).

USPTO; Office Action dated Nov. 30, 2011, from related U.S. Appl. No. 13/267,262 (filed Oct. 6, 2011).

US 8,239,725 B2

DATA STORAGE WITH AN OUTER BLOCK CODE AND A STREAM-BASED INNER CODE

CROSS-REFERENCE TO RELATED APPLICATION

This application is a continuation application of U.S. application Ser. No. 11/774,377, filed Jul. 6, 2007, issued as U.S. Pat. No. 8,065,583 on Nov. 22, 2011, the entirety of which is incorporated by reference herein.

This application is related to commonly-owned and copending application titled ERROR RECOVERY STORAGE ALONG A NAND-FLASH STRING, Ser. No. 11/774,316, filed on Jul. 6, 2007, the entirety of which is hereby incorporated by reference.

BACKGROUND

1. Field of the Invention

Embodiments of the invention generally relate to integrated circuits. In particular, embodiments of the invention relate to memory circuits.

2. Description of the Related Art

Flash memory is a form of erasable and reprogrammable non-volatile memory. In a flash memory, memory cells are arranged in "blocks" for erasure. After a block has been erased, it is ready for programming if desired. NOR flash memory is a type of flash memory that offers access to individual bytes for retrieval of data, but has relatively low density.

NAND flash memory is a type of flash memory that offers relatively high density. The high density is achieved in part by forming columns of cells connected in series. In addition, with NAND flash memory, data is programmed and accessed in relatively large groups of bytes, such as a page of data. For example, a page can correspond to a row or to a portion of a row in an array.

For example, a memory array of cells for storing data is typically arranged in a 2-dimensional array of rows and columns. These arrays can vary greatly in size. When the cells of the array are capable of holding 2 or more levels, that is, multiple levels or two or more bits of data per cell, the array effectively holds data in 3 dimensions.

In a typical array for NAND flash memory, sources and drains of flash cells are arranged in series (source to drain) and referred to as columns. Along rows are "word lines" that control the gates of cells. Data is typically accessed a row at a time, with one bit from each column. The word line for the row to be read is set to a particular voltage for reading the stored state(s) of the cells. Different voltage levels can be used for multiple-level cells. The other row lines for the other cells of the columns are set to turn "on" the cells to permit the reading of the stored state(s) of the cells of the row through the corresponding cells in the columns.

The number of bytes per row can vary in a very wide range as can the number of bytes in a "page." Some manufacturers define a page by a certain amount of data, so that, for example, two pages of data can correspond to one word line (row). For the purposes described herein, a "page" of data corresponds to the amount of data that is written to or read from the NAND flash memory array during a write cycle or read cycle. In one example, 2,112 bytes are retrieved by activation of a word line. Of these 2,112 bytes, 2,048 are data bytes and 64 are spare bytes, which are typically used for error correction codes (ECC), wear-leveling information, logical address mapping, or other overhead data. Error correction codes increase the robustness of the stored data. Typically, a form of block code is used to generate the error correction codes, such as cyclic redundancy check (CRC) checksums, Reed-Solomon error correction, or the like. These error correction codes detect if there were errors in the reading of the data bytes and can typically correct errors in the data bytes provided that the errors do not exceed the capability of the error correction code.

Flash memory has many uses. Examples include flash memory hard drives (replacements for hard drives), USB flash drives or thumb drives, mobile phones, digital cameras, digital media players, games, memory cards, navigation devices, personal digital assistants, computers, or the like. Within limits, the error correction codes can correct many errors in the data in the data bytes. However, beyond these limits, data with errors cannot typically be corrected. For example, if a word line fails, then there can be problems reading data for the entire row. This typically results in too many errors for the error correction codes to correct. Depending on the criticality of the data, the effects of uncorrectable errors in data can range from inconvenient to catastrophic.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Figure 1:
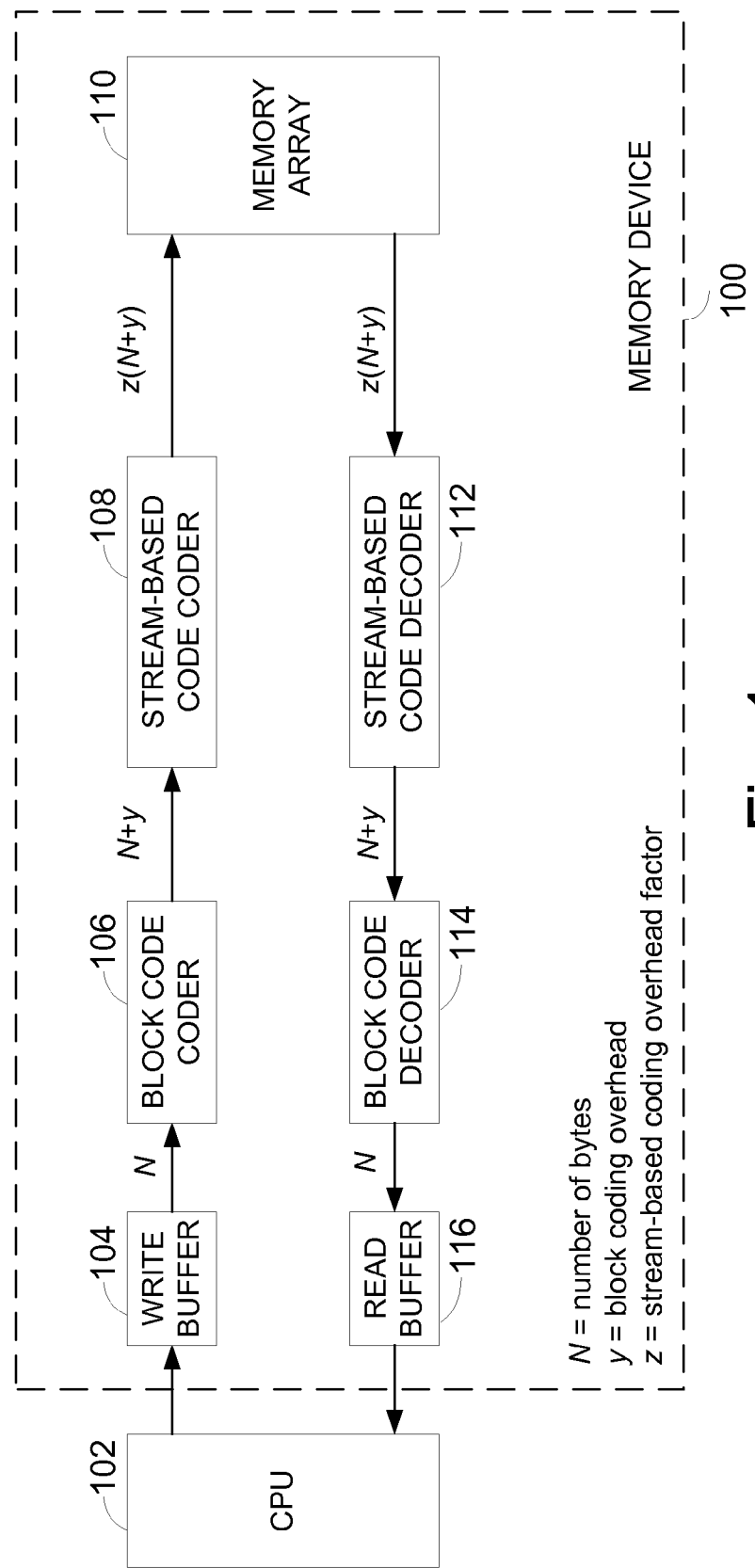
FIG. 1 is a schematic including a memory device, wherein the memory device stores data with an outer block code and a stream-based inner code.
Figure 3:
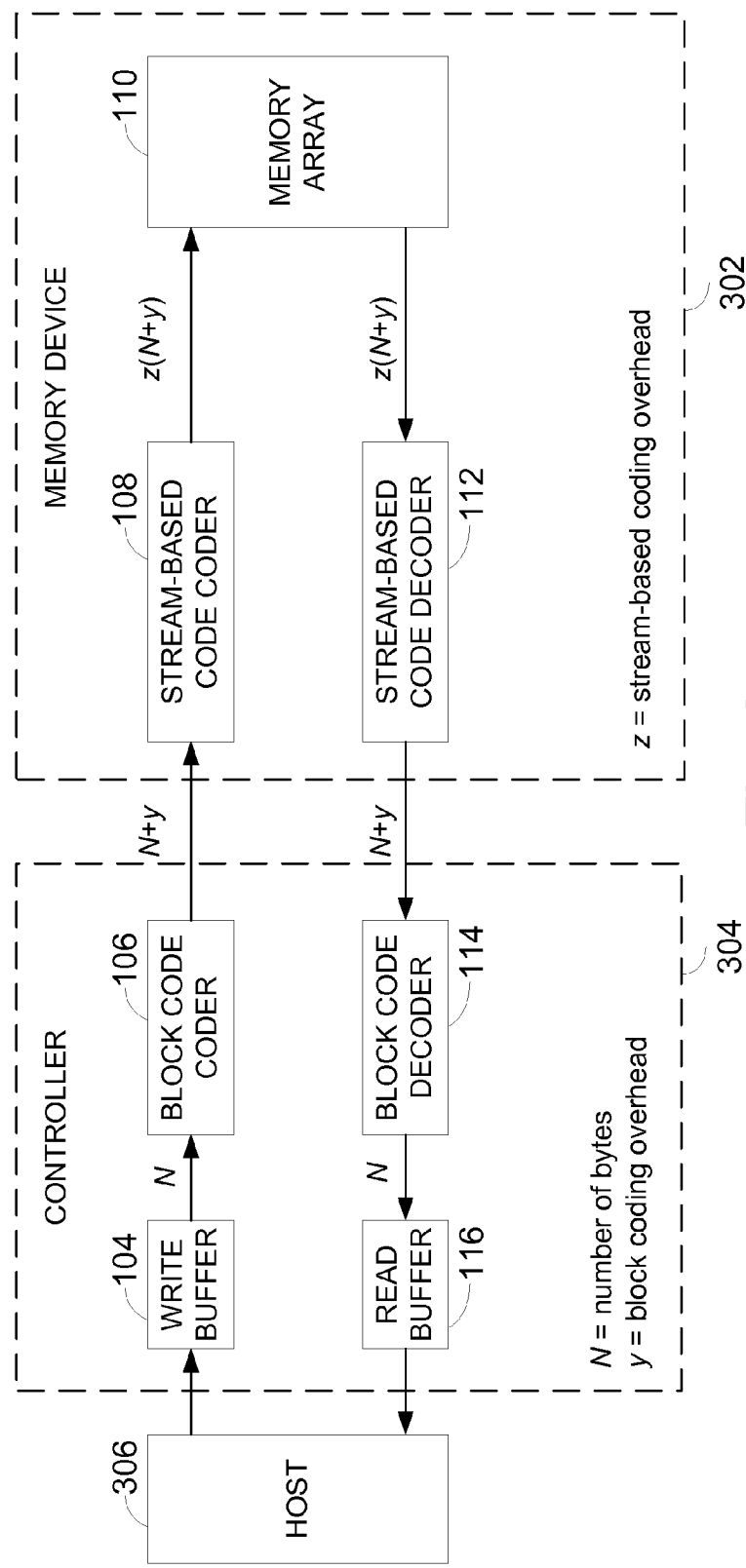
FIG. 3 is a schematic illustrating a memory device, wherein the memory device stores data with a stream-based code such that it effectively has a better (lower) bit error rate (BER) than if the stream-based code were not used.

FIG. 1 is a schematic including a memory device 100, wherein the memory device 100 stores data using an outer block code concatenated with a stream-based inner error correction code to generate a concatenated code. In contrast to block codes that process data in blocks, the stream-based inner error correction code processes the data in streams or channels. Accordingly, the coding of the concatenated data is dependent on prior data received by the stream-based code coder. In one embodiment, the stream-based code is a convolutional code. The memory device 100 is illustrated in communication with a CPU 102, which represents another device using the memory device 100. The CPU 102 can correspond to a microprocessor, a controller, signal processor, or the like. The illustrated memory device 100 includes a write buffer 104, a block code coder 106, a stream-based code coder 108, a memory array 110, a stream-based code decoder 112, a block code decoder 114, and a read buffer 116. FIG. 3 illustrates an alternative configuration with fewer functional blocks. The block code coder 106 and the stream-based code coder 108 are each forward error correction (FEC) coders.

In one embodiment, the memory array 110 corresponds to a NAND flash memory array. The NAND flash memory array can be of single level, multi-level, or can even correspond to multiple arrays. While particular embodiments will be described in the context of NAND flash memory, the principles and advantages described herein are applicable to other types of memories. A very wide range of non-volatile solid state memory types can be used for the memory array 110. For example, the memory array 110 can correspond to other forms of flash (e.g., NOR type), electrically erasable programmable read only memory (EEPROM), magnetoresistive random access memory (MRAM), programmable conductor memory, ferroelectric memory, and the like.

The block code coder 106 generates the outer block code. The stream-based code coder 108 generates the inner stream-based code, e.g., convolutional code. The stream-based code decoder 112 decodes the inner stream-based code, and the block code decoder 114 decodes the outer block code. The concatenation of the outer block code and the inner stream-based code improves the integrity of the stored data and increases the likelihood of recovering correctable data. For example, the use of the inner stream-based code can lower the bit error rate (BER) associated with the memory device 100. The reduction in the BER is observed by the device using the memory device 100, such as a host or the CPU 102.

The CPU 102 or controller provides data to the write buffer 104 for storage to the memory array 110. Typically, for NAND flash, a page of data is written to the memory array 110 at a time. This page of data can vary in size. Typical page sizes include, but are not limited to, 512 bytes, 1024 bytes, 2048 bytes, and the like. In the schematic, a variable N represents the number of bytes for a page.

This N number of bytes is encoded by the block code coder 106. Examples of block codes include, but are not limited to, a Hamming code, a Reed-Solomon error correction code, a Bose, Chaudhuri, Hocquenghem (BCH) code, or the like. Within limits, these block error correction codes can detect and correct many errors in the data. The error correction codes from the block codes occupy additional bytes represented in FIG. 1 as variable y number of block code bytes. In a conventional NAND flash memory array, the block codes are typically stored in a spare bytes area for the corresponding page. For the purposes of illustration, these possible extra bytes are included in the variable y. Accordingly, for a conventional NAND flash memory array, N+y bytes are stored for the page for data and for error correction data. The type of block code used and the number of error correction bytes y are typically specified for a particular device by an applicable industry standard, such as by a JEDEC standard. Typically, for a block code, the N bytes of the N+y bytes remain the same data, and the y block code bytes for error correction are appended to the data. The N bytes can be considered the original data for the block code coder 106, and the N+y bytes can be considered the original data for the stream-based coder 108.

In the illustrated embodiment, the stream-based code coder 108 performs a stream-based coding process on the N+y bytes of data. The stream-based coding increases the amount of data stored by a factor z such that z(N+y) bytes are stored in the memory array 110 for the concatenated page of data. With stream-based coding, the resulting z(N+y) bytes are typically unique from the original Nor N+y bytes of data, i.e., the Nor N+y bytes of data are not recognizable without decoding. This can render decoding relatively difficult as compared to decoding of block codes. However, techniques such as the Viterbi algorithm can be used to decode convolutional codes in a relatively efficient manner.

This factor z can vary. For example, the code rate (m/n) and the constraint length k for a convolutional code can affect the size of the factor z. The factor z can vary in a very broad range, but will be greater than 1. In one embodiment, the stream-based code is a convolutional code, and the factor z is 2. A simple convolutional coding example will be described later in connection with FIG. 2, with a factor z of 2. With the growth in size of the data, memory address can also be mapped internally to the memory device to reflect the increase in the size of the data stored.

For clarity, familiar components such as buffers, row decoders, sense/amplifier circuits and the like are not shown in FIG. 1. When data is requested, the applicable portion of the memory array 110 is accessed. For a page of data, z(N+y) bytes are retrieved from the memory array 110. The stream-based code decoder 112 decodes, e.g., deconvolves, the stream-based coded z(N+y) bytes to N+y block-coded bytes. Within limits of the code, the decoding process detects and corrects errors. In one embodiment, the stream-based code decoder 112 is a Viterbi decoder (for decoding of convolutional codes). Advantageously, this extra stream-based coding reduces the number of errors, if any, in the resulting block-coded N+y bytes and improves the probability that the block-coded N+y bytes will be correctable.

The block code decoder 114 decodes the z(N+y) bytes of block-coded data and generates N bytes of corrected data (unless the errors are uncorrectable). The N bytes of corrected data are placed in the read buffer 116 for access by the CPU 102.

Figure 2:
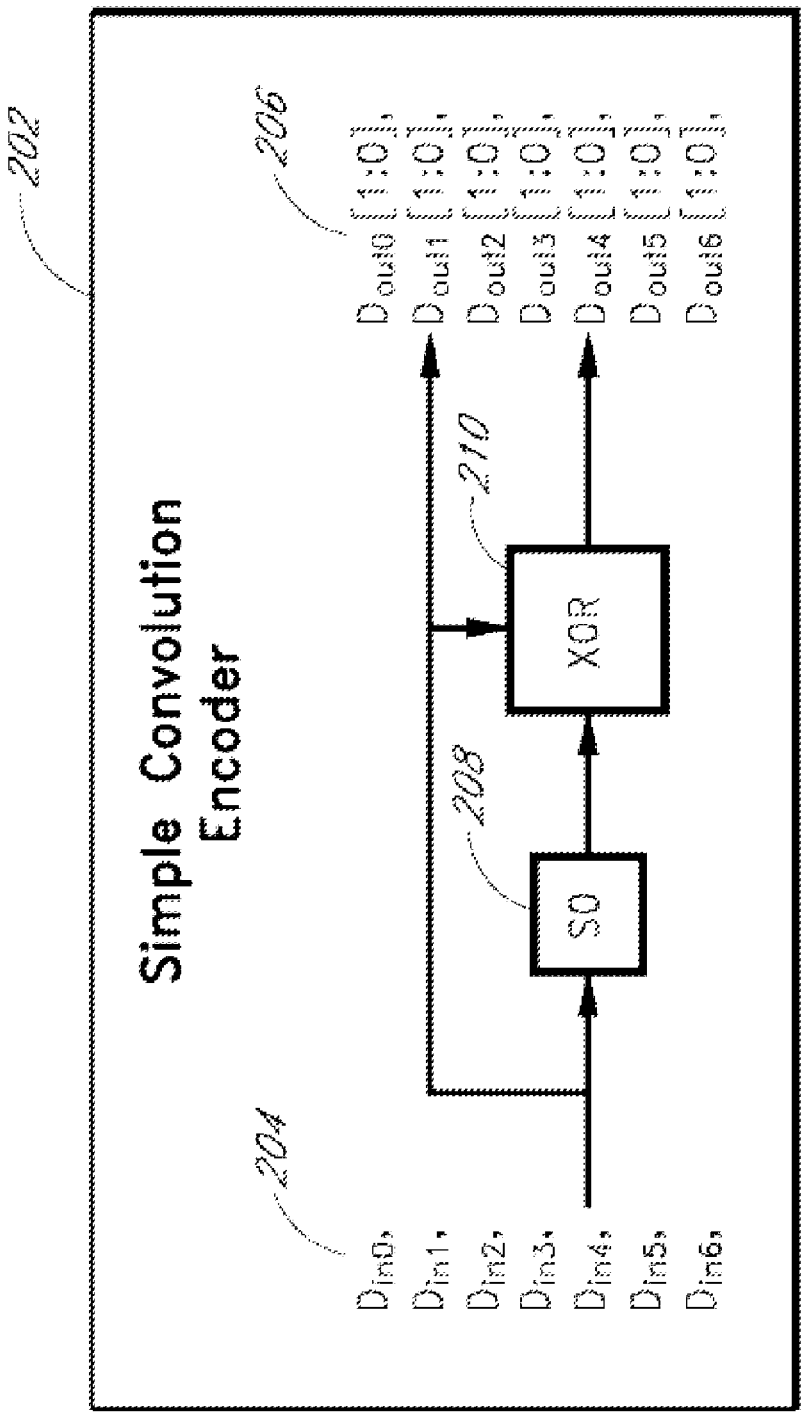
FIG. 2 illustrates an example of a convolutional coder for the stream-based inner coding.

FIG. 2 illustrates an example of a convolutional coder 202 for the inner stream-based coding. While illustrated in the context of convolutional codes, the principles and advantages are applicable to other types of codes. Stream-based coding can be performed by hardware or by software (or firmware as applicable), or by a combination of both. In one embodiment, stream-based coding is performed by dedicated hardware integrated with the memory device 100 or by a controller outside of the memory device 100. The particular convolutional coder 202 illustrated in FIG. 2 is a simple example of convolutional coding and is not intended to be limiting. An implementation of convolutional coding can vary widely with respect to many parameters, such as, but not limited to, constraint lengths, generator polynomials, and the like.

Data 204 indicates the N+y bytes of data from the block code coder 106 that would normally be stored in a conventional memory device. Data 206 indicates the convolutional coded z(N+y) bytes of data generated by convolution coding of data 204. In the simple example, data 204 is convolved using a register 208 and an exclusive-OR (XOR) gate 210.

In the illustrated example, the lower number bits are written earlier than the higher numbered bits. The register 208 can be initialized to zero for the first data bit (first memory cell of the string), or can be initialized to one.

FIG. 3 is a schematic illustrating a memory device 302, wherein the memory device 302 stores data with a stream-based code such that it effectively has a better (lower) bit error rate (BER) than if the stream-based code were not used. The groupings of the components illustrated in FIG. 3 vary from the grouping in FIG. 1. The groupings can vary depending on the specifications for the memory devices 100, 302, depending on whether the memory devices 100, 302 are provided at the die level or packaged, and the like.

The memory device 302 is operatively coupled to a controller 304, which is in communication with a host 306. For example, the host 306 and the controller 304 can be of a legacy specification. The controller 304 can be part of the host 306 or can be part of the memory device 302. For example, in the context of memory cards, e.g., SmartMedia, Secure Digital, or the like, some memory card formats specify the controller 304 to be onboard the memory device 302, while other formats specify the controller 304 to be part of the host 306.

In the illustrated example, the memory device 302 includes the stream-based code coder 108, the memory array 110, and the stream-based code decoder 112. These components were described earlier in connection with FIG. 1. The controller 304 includes the write buffer 104, the block code coder 106, the block code decoder 114, and the read buffer 116. These components were also described earlier in connection with FIG. 1. One of ordinary skill in the art will appreciate that other components, such as buffers, cache registers, address data, multiplexing/demultiplexing components, serializing/deserializing components, and control components can also be present as applicable. Further details of possible configurations for the memory device 302 will be described later in connection with FIGS. 4 and 5.

While it may appear that the allocation of available memory space for additional error correction would be counter productive to the low-cost production of memory chips at low cost, the reverse can be true in certain situations. One example is compatibility with relatively old, i.e., legacy, memory system requirements.

The difference in density between a relatively new memory array and a relatively old memory array can be fairly dramatic. For example, the geometry feature size of a relatively new memory array is about ⅓ of that of a relatively old memory array. This increases the chip density by a factor of about 10. However, as the individual memory cells shrink, they also typically become individually less reliable and more susceptible to noise. This can render relatively new memory devices with small geometry unusable with the legacy specifications. With the legacy amount of error correction coding, the relatively small geometry devices would typically fail the bit error rate (BER) specification. This problem can be addressed by changing a specification to increase the amount of block coding; however, the increase in block coding would then negate compatibility with an existing specification.

One embodiment transparently applies the inner stream-based code to the block-coded data such that a host is unaware that a stream-based code is being used. This advantageously permits a relatively new and low-cost memory device to meet the bit error rate (BER) requirements while outwardly using only the block coded data specified for a legacy device. For example, even if half of the memory capacity were to be used, a small-geometry memory device of about 10 times the density would still be about 5 times more dense and thus cheaper than a larger-geometry device. This can further permit a manufacturer to build products for a wider range of product lines from relatively fewer production lines.

Figure 4:
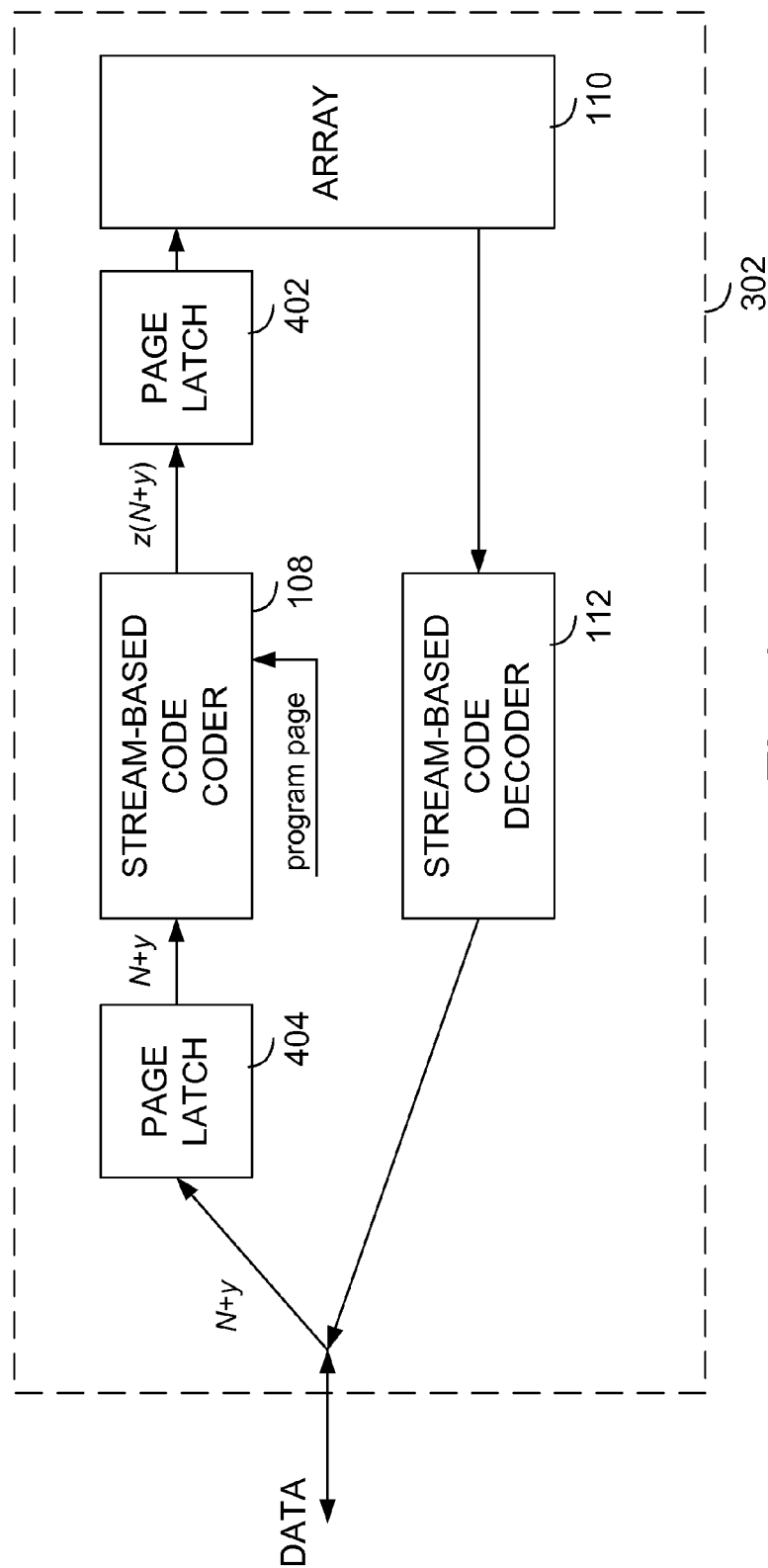
FIG. 4 is a schematic illustrating one embodiment of a memory device wherein data can be loaded in arbitrary order.

FIG. 4 is a schematic illustrating one embodiment of the memory device 302 wherein data can be loaded in arbitrary order. In the configuration illustrated in FIG. 4, the memory device 302 includes a first page latch 402 and a second page latch 404. The second page latch 404 stores a page of data received from an interface. The second page latch 404 accumulates this data so that the stream-based code coder 108 can process the forward error correction coded data of the stream-based coding operation. For example, with convolutional coding, the correction coding of data depends on earlier values of data. By storing the page of data in the second page latch 404 before coding, the data can be received in arbitrary order.

In one embodiment, the stream-based code coder 108 initiates the coding process after the page of data has been loaded into the second page latch 404. An indication, such as a "program page" signal can be used to indicate the readiness of the data. For an ordinary memory device, the program page signal from the host 306 or controller 304 (FIG. 3) initiates the storage into the array. It will be understood that for flash memory devices, the applicable portion of the array may need to be erased prior to programming. In one embodiment, the program page signal is used to initiate the additional error correction by the stream-based code coder 108, and when the coding is complete, the stream-based code coder 108 initiates the programming of data from the first page latch 402 to the memory array 110.

For a page of N data bytes, the second page latch 404 typically stores N+y data bytes. Advantageously, as the N+y data bytes are stored in the second page latch 404, the memory device 302 can receive the data bytes for the page without a specific order. After the data for the page has been received, the stream-based code coder 108 encodes the N+y data bytes to the z(N+y) bytes with stream-based coding, such as convolutional coding. These z(N+y) bytes are stored in the first page latch 402 for writing to the memory array 110.

Figure 5:
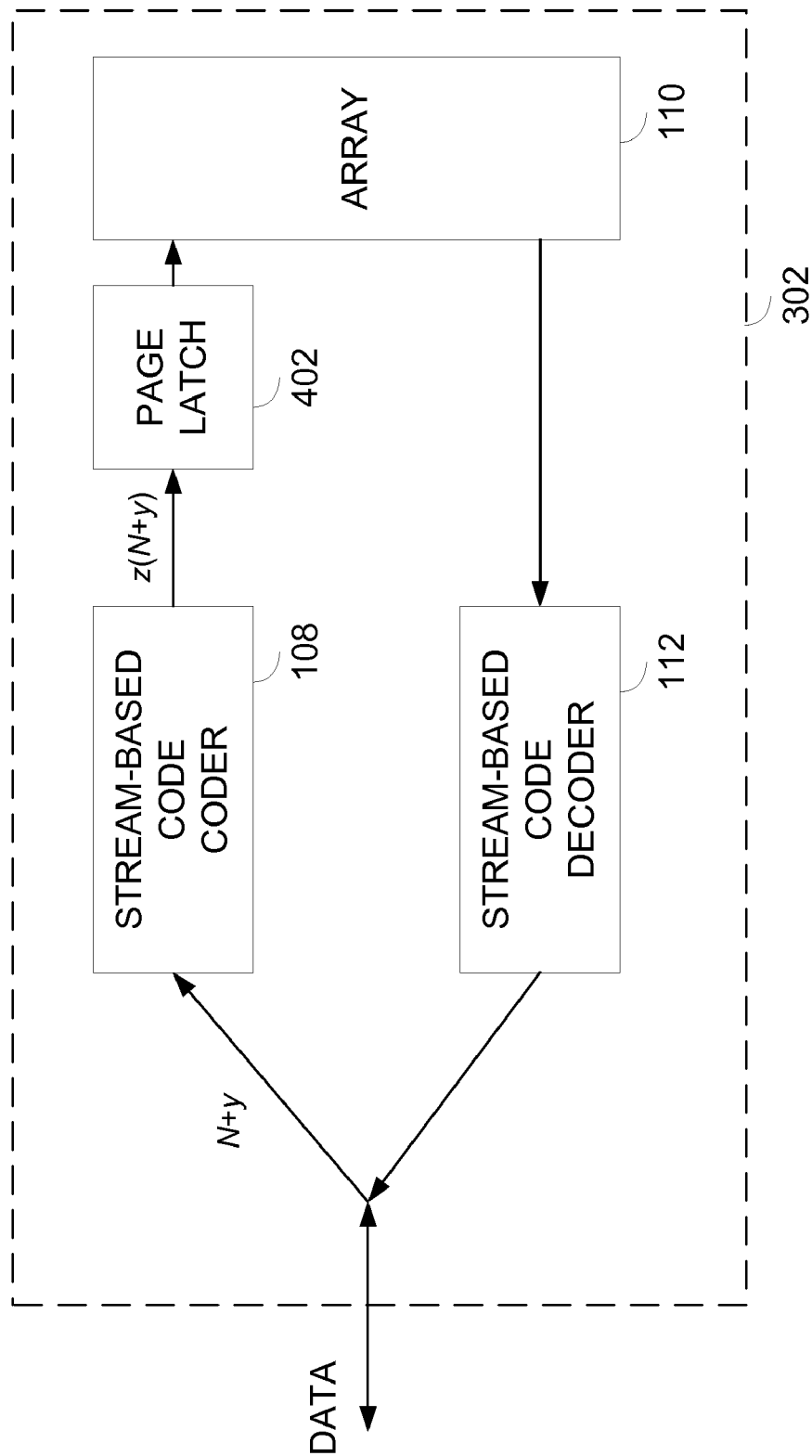
FIG. 5 is a schematic illustrating one embodiment of a memory device with relatively few components.

FIG. 5 is a schematic illustrating one embodiment of the memory device 302 with relatively fewer components. As compared to the embodiment described earlier in connection with FIG. 4, the data from the interface is not stored in a page latch prior to encoding. A smaller latch or register (smaller than a page) is used instead. This can reduce cost. However, the computation of some codes, such as convolutional codes, is dependent on prior values of data. Accordingly, without the second page latch 404, the data from an interface may need to be provided in such an order that the stream-based code coder 108 can process the inner error correction code.

One embodiment is an apparatus, wherein the apparatus includes: one or more memory arrays for storage of data; a stream-based coder configured to generate a page of forward error correction coded data of a page of original data intended for storage in the one or more memory arrays such that the coded page of data is larger than the page of original data and such that the original data is not recognizable in the coded data without decoding the coded data; a page latch operatively coupled to the stream-based coder, wherein the page latch is at least large enough to hold the page of coded data for writing to the one or more memory arrays; and a stream-based decoder configured to decode coded data retrieved from the one or more memory arrays to generate decoded data.

One embodiment is a method for storing data in a device having one or more memory arrays, wherein the method includes: receiving block-coded data for storage in the one or more memory arrays; concatenating the block-coded data with a forward error correction code to generate a concatenated code that is larger in size than the original block-coded data; and storing the concatenated code in the one or more memory arrays.

One embodiment is a method of retrieving a first data stored in a memory device, wherein the method includes: receiving a request for the first data; retrieving a concatenated data from one or more memory arrays, wherein the concatenated data corresponds to the first data and a first block code of the first data concatenated with a second forward error correction code; and decoding the concatenated data to generate the first data and block codes.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

I claim:

1. A method for storing data in a device having one or more memory arrays, the method comprising:
   receiving block-coded data comprising N+y bytes of data, wherein the N+y bytes of data comprises N bytes of page data and y bytes of block-type error correction data for the page data;
   with a stream-based code coder, concatenating the N+y bytes of the block-coded data with a stream-based forward error correction technique to generate a concatenated code that is a factor z times larger in size than the N+y bytes of original block-coded data such that the concatenated code has z(N+y) bytes; and
   storing the concatenated code in the one or more memory arrays;
   wherein the one or memory arrays intrinsically has a first bit error rate, wherein with the additional forward error correction of the stream-based forward error correction technique has a second bit error rate lower than the first error rate such that the one or more memory arrays can be used to satisfy a bit error specification that would not be met by the first bit error rate.

2. The method of claim 1, wherein concatenating comprises encoding with a convolutional code.

3. The method of claim 1, wherein concatenating further comprises transparently encoding such that a host device is unaware that the concatenating is taking place.

4. The method of claim 1, wherein the one or more memory arrays comprise one or more flash memory arrays.

5. The method of claim 1, further comprising:
   temporarily storing a page of block-coded data;
   determining an activation of a program page signal, wherein the program page signal is received in the stream-based code coder; and
   initiating concatenating at least partially in response to the activation of the program page signal.

6. A method for storing data in a device having one or more memory arrays, the method comprising:
   receiving block-coded data comprising N+y bytes of data, wherein the N+y bytes of data comprises N bytes of page data and y bytes of block-type error correction data for the page data;
   temporarily storing a page of block-coded data, wherein the page of block-coded data is temporarily stored in a page latch;
   determining an activation of a program page signal, wherein the program page signal is received in a stream-based code coder;
   with the stream-based code coder, concatenating the N+y bytes of the block-coded data with a stream-based forward error correction technique to generate a concatenated code that is a factor z times larger in size than the N+y bytes of original block-coded data such that the concatenated code has z(N+y) bytes, and initiating concatenating at least partially in response to the activation of the program page signal; and
   storing the concatenated code in the one or more memo arrays.

7. A method for storing data in a device having one or more memory arrays, the method comprising:
   receiving N bytes of page data;
   with a block code coder, generating y bytes of block-type error correction code from the N bytes of page data such that there are N+y bytes of block-coded data;
   with a stream-based code coder, concatenating the N+y bytes of the block-coded data with a stream-based forward error correction technique to generate a concatenated code that is a factor z times larger in size than the N+y bytes of block-coded data such that the concatenated code has z(N+y) bytes; and
   storing the concatenated code in the one or more memory arrays
   wherein the one or memory arrays intrinsically has a first bit error rate, wherein with the additional forward error correction of the stream-based forward error correction technique has a second bit error rate lower than the first error rate such that the one or more memory arrays can be used to satisfy a bit error specification that would not be met by the first bit error rate.

8. The method of claim 7, wherein concatenating comprises encoding with a convolutional code.

9. The method of claim 7, wherein concatenating further comprises transparently encoding such that a host device is unaware that the concatenating is taking place.

10. The method of claim 7, wherein the one or more memory arrays comprise one or more flash memory arrays.

11. The method of claim 7, further comprising:
    temporarily storing a page of block-coded data;
    determining an activation of a program page signal, wherein the program page signal is received in the stream-based code coder; and
    initiating concatenating at least partially in response to the activation of the program page signal.

12. A method for storing data in a device having one or more memory arrays, the method comprising:
    receiving N bytes of page data;
    temporarily storing a page of block-coded data, wherein the page of block-coded data is temporarily stored in a page latch;
    determining an activation of a program page signal, wherein the program page signal is received in the stream-based code coder;
    with a block code coder, generating y bytes of block-type error correction code from the N bytes of page data such that there are N+y bytes of block-coded data;
    with a stream-based code coder, concatenating the N+y bytes of the block-coded data with a stream-based forward error correction technique to generate a concatenated code that is a factor z times larger in size than the N+y bytes of block-coded data such that the concatenated code has z(N+y) bytes, and initiating concatenating at least partially in response to the activation of the program page signal; and
    storing the concatenated code in the one or more memory arrays.

* * * * *

UNITED STATES PATENT AND TRADEMARK OFFICE
CERTIFICATE OF CORRECTION

PATENT NO.         : 8,239,725 B2
APPLICATION NO.    : 13/281007
DATED              : August 7, 2012
INVENTOR(S)        : William H. Radke Page 1 of 1

It is certified that error appears in the above-identified patent and that said Letters Patent is hereby corrected as shown below:

In column 7, line 16, in Claim 1, after "or" insert -- more --.

In column 7, line 19, in Claim 1, after "first" insert -- bit --.

In column 7, line 57, in Claim 6, delete "memo" and insert -- memory --, therefor.

In column 8, line 15, in Claim 7, after "or" insert -- more --.

In column 8, line 18, in Claim 7, after "first" insert -- bit --.

Signed and Sealed this
Second Day of October, 2012

David J. Kappos
*Director of the United States Patent and Trademark Office*